US008821635B2

(12) United States Patent
Kouvetakis et al.

(10) Patent No.: US 8,821,635 B2
(45) Date of Patent: Sep. 2, 2014

(54) METHOD FOR GROWING SI-GE SEMICONDUCTOR MATERIALS AND DEVICES ON SUBSTRATES

(75) Inventors: John Kouvetakis, Mesa, AZ (US); Ignatius S. T. Tsong, Tempe, AZ (US); Changwu Hu, Gilbert, AZ (US); John Tolle, Gilbert, AZ (US)

(73) Assignee: Arizona Board of Regents on Behalf of Arizona State University, Tempe, AZ (US)

( * ) Notice: Subject to any disclaimer, the term of this patent is extended or adjusted under 35 U.S.C. 154(b) by 1368 days.

(21) Appl. No.: 11/662,669

(22) PCT Filed: Apr. 8, 2005

(86) PCT No.: PCT/US2005/012157
§ 371 (c)(1),
(2), (4) Date: Aug. 22, 2007

(87) PCT Pub. No.: WO2006/031257
PCT Pub. Date: Mar. 23, 2006

(65) Prior Publication Data
US 2008/0113186 A1 May 15, 2008

Related U.S. Application Data

(63) Continuation of application No. PCT/US2004/043854, filed on Dec. 31, 2004.

(60) Provisional application No. 60/610,120, filed on Sep. 14, 2004, provisional application No. 60/660,779, filed on Mar. 11, 2005.

(51) Int. Cl.
*C30B 25/02* (2006.01)
*H01L 21/02* (2006.01)
*B82Y 10/00* (2011.01)
*C30B 29/52* (2006.01)
*B32B 15/02* (2006.01)
*C30B 23/02* (2006.01)

(52) U.S. Cl.
CPC .......... *B32B 15/02* (2013.01); *H01L 21/02573* (2013.01); *B82Y 10/00* (2013.01); *C30B 25/02* (2013.01); *H01L 21/02381* (2013.01); *C30B 29/52* (2013.01); *H01L 21/02532* (2013.01); *H01L 21/02636* (2013.01); *H01L 21/0262* (2013.01); *C30B 23/02* (2013.01)
USPC .................. 117/88; 117/89; 117/91; 117/92; 117/95; 117/96; 117/99; 117/101; 117/103; 117/104; 117/105; 117/108; 257/19; 257/616; 257/E21.101; 257/E21.102; 423/324; 423/344; 423/347; 438/503; 438/507

(58) Field of Classification Search
USPC .............. 117/88–89, 91–92, 95–96, 99, 101, 117/103–105, 108, 935–936, 939; 257/19, 257/616, E21.101, E21.102; 423/324, 344, 423/347; 438/503, 507
See application file for complete search history.

(56) References Cited

U.S. PATENT DOCUMENTS

| 2,988,427 | A | 6/1961 | Jenker et al. |
| 4,777,023 | A | 10/1988 | Fieselmann et al. |
| 4,910,153 | A * | 3/1990 | Dickson .......................... 438/96 |
| 7,598,513 | B2 | 10/2009 | Kouvetakis et al. |
| 2003/0019668 | A1* | 1/2003 | Reade et al. .................... 177/84 |
| 2004/0040493 | A1 | 3/2004 | Vineis et al. |
| 2006/0163612 | A1 | 7/2006 | Kouvetakis et al. |
| 2007/0297967 | A1 | 12/2007 | Kouvetakis et al. |
| 2009/0050935 | A1* | 2/2009 | Kouvetakis et al. .......... 257/190 |
| 2010/0012972 | A1* | 1/2010 | Kouvetakis et al. .......... 257/183 |

FOREIGN PATENT DOCUMENTS

WO 2004036631 4/2004

OTHER PUBLICATIONS

C. Hu, et al. in "Synthesis of highy coherent SiGe and Si4Ge nanostructures by molecular beam epitaxy of H3SiGeH3 and Ge(SiH3)4," Chemistry of Materials, vol. 15, pp. 3569-3572, Sep. 23, 2003 edition. Published on the web on Aug. 28, 2003.*

M. Bauer, et al. in "Synthesis of ternary SiGeSn semiconductors on Si(100) via SnxGe1-x buffer layers," Appl. Phys. Lett. 83, 2163 (2003). Published online on Sep. 8, 2003.*
N.E. Lee, et al. in "Growth, microstructure, and strain relaxation in low-temperature epitaxial Si1-xGex alloys deposited on Si(001) from hyperthermal beams," J. Appl. Phys. 80, 812 (1996).*
Andrews, et al. (1966) J. Chem. Soc. (A), p. 46-48.
Hu, et al. (2003) Chemistry of Materials: American Chemical Society, 15(19):3569-3572.
Bauer, et al. (2003) Applied Physics Letters, 83(11): 2163-2165.
Wolf, et al. (1986) Processing for the VLSI ERA. vol. 1: Process Technology; Lattice Press; Sunset Beach, CA; Chapter 6, pp. 161-197.
Gaiduk, et al. (2000) Thin Solid Films, 367 (1-2): 120-125.
Supplemental ISR EP 05746524, mailed Jan. 31, 2011.
Chizmeshya, et al., J. Am. Chem. Soc. 2006, 128 (21), 6919-6930.
Gersten, et al., The Physics and Chemistry of Materials, John Wiley & Sons; New York, 2001, pp. 96-100.
Dutton, et al., Inorganic Chemistry, 1968, 7(9), pp. 1735-1739.
Lobreyer, T., Chem Ber, 1991, 124(11), 2405-2410.
Mackay, K.M., et al, J. Chem Soc, 1969, A, 2938.
Mooney, P. M.; et al. Annu. Rev. Mater. Sci. 2000, 30, 335.
Tromp, R. M.; et al. Annu. Rev. Mater. Sci. 2000, 30, 431.
Brunner, K., et al., Rep. Prog. Phys. 2002, 65(1), 27-72.
Kuo, Y-H; et al. Nature 2005, 437, 1334.
Bean, J, C; et al. J. Vac Sci. Technol. 1984, A 2(2), 436-440.
Greve, D.W., Mat. Sci. Eng., 1993, B18(1), 22-51.
Konig, U., et al., IEEE Electron Device Lett, 1993, 14(4), 205-207.
M. L. Lee, J. Appl. Phys. 2003, 94, 2590-2596.
R. Hamond, Electron. Lett. 1999, 35(18), 1590-1591.
Y. J. Mii, Appl. Phys. Lett., 1991, 59(13), 1611-1613.
P. M. Mooney, Appl. Phys. Lett., 1995, 67(16), 2373-2375.
K. K. Linder, Appl. Phys Lett., 1997, 70(24), 3224-3226.
C. S. Peng, Appl. Phys. Lett., 1998, 72(24), 3160-3162.
Lee, M. L.; et al. J. Vac. Sci.Technol. 2004, B 22 (1), 158.
E. Kasper, et al., Appl Surf. Sci. 2004, 224, 3.
Currie, M. T.; et al. Appl. Phys. Lett. 1998, 72 (14), 1718.
G. Eres, et al., J. Vac. Sci. Technol., 1993, A11(5), 2463-2471.
T. R. Bramblett, et al. J. Appl. Phys., 1995, 77(4), 1504-1513.
J. Takahashi, et al., Appl. Phys. Lett., 1991, 58(24), 2776-2778.
Ritter, C.J.; et al. J. of the Am. Chem. Soc., 2005, 127(27), 9855-9864.
Hu, C.-W.; et al. Applied Physics Letters, 2005, 87(18), 181903/1-3.
Nijhawan, S.; et al. J. Aerosol Science 2003, 34, 691-711.
Soldner, M.; et al. J. Organometallic Chem. 1996, 521, 295.
Urban, J.; et al. J. Chem. Phys. Lett. 1997, 264, 441-448.
Albinsson, B.; et al. J. Phys. Chem. 1996, 100, 8681.
Jasinski, J. M.; et al. Chem. Rev. 1995, 95, 1203.
Cullis, A.G.; et al. J. Cryst. Growth 1992, 123, 333.

\* cited by examiner

*Primary Examiner* — Michael Kornakov
*Assistant Examiner* — Kenneth A Bratland, Jr.
(74) *Attorney, Agent, or Firm* — McDonnell Boehnen Hulbert & Berghoff LLP

(57) ABSTRACT

Si—Ge materials are grown on Si(100) with Ge-rich contents (Ge>50 at. %) and precise stoichiometries SiGe, $SiGe_2$, $SiGe_3$ and $SiGe_4$. New hydrides with direct Si—Ge bonds derived from the family of compounds $(H_3Ge)_x SiH_{4-x}$ (x=1-4) are used to grow uniform, relaxed, and highly planar films with low defect densities at unprecedented low temperatures between about 300-450° C. At about 500-700° C., $SiGe_x$ quantum dots are grown with narrow size distribution, defect-free microstructures and highly homogeneous elemental content at the atomic level. The method provides for precise control of morphology, composition, structure and strain. The grown materials possess the required characteristics for high frequency electronic and optical applications, and for templates and buffer layers for high mobility Si and Ge channel devices.

39 Claims, 6 Drawing Sheets

METHOD FOR GROWING SI-GE SEMICONDUCTOR MATERIALS AND DEVICES ON SUBSTRATES

RELATED APPLICATION DATA

This application is based on and claims the benefit of U.S. Provisional Patent Application No. 60/610,120 filed on Sep. 14, 2004, entitled "Synthesis of new compositions of matter in the $(H_3Ge)_{4-x}SiH_x$ (x=0-3) family of Si—Ge hydrides: Novel pathways to Ge-rich $Ge_{1-x}Si_x$ heterostructures and nanostructures on Si" and naming as inventors John Kouvetakis, Ignatius S. T. Tsong, Jose Menendez, John Tolle, Cole J. Ritter III and Chang Wu Hu, the disclosure of which is incorporated herein by this reference.

This application claims the priority of PCT Patent Application No. PCT/US05/12157, filed on Apr. 8, 2005, which is a continuation of PCT/US04/43854, filed on Dec. 31, 2004, entitled "Hydride Compounds with Silicon and Germanium Core Atoms and Method of Synthesizing Same" and naming as inventors John Kouvetakis, Cole J. Ritter III and John Tolle, the disclosure of which is incorporated herein by this reference.

This application is based on and claims the benefit of U.S. Provisional Patent Application No. 60/660,779 filed on Mar. 11, 2005, entitled "Integration of GaAs, Al—Ga—As and Related III-V and II-VI Compound Semiconductors with Si via SiGeSn Buffer Layers" and naming as inventors John Kouvetakis, Radek Roucka, John Tolle and Ignatius S. T. Tsong, the disclosure of which is incorporated herein by this reference.

STATEMENT OF GOVERNMENT FUNDING

The United States Government provided financial assistance for this project through the National Science Foundation under Grant Nos. DMR-0221993 and DMR-0303237 and a grant by the Army Research Office. Therefore, the United States Government may own certain rights to this invention.

BACKGROUND

This invention relates generally to semiconductor materials. More particularly, it relates to a method for growing epitaxial Ge-rich SiGe layers on Si substrates using single source $(H_3Ge)_xSiH_{4-x}$ precursor compounds incorporating SiGe, $SiGe_2$, $SiGe_3$ and $SiGe_4$ building blocks.

The growth of $Si_{1-x}Ge_x$ alloys on Si(100) substrates has been the subject of intensive research over the past two decades due to applications in high frequency electronic devices. Several comprehensive reviews describing fundamental issues related to materials and devices based on Si-rich alloys have been written recently. These include P. M. Mooney and J. O. Chu, "SiGe Technology: Heteroepitaxy and High-Speed Microelectronics", Annu. Rev. Mater. Sci., vol. 30, 2000, pp. 355-362; M. Tromp and F. M. Ross, "Advances in situ ultra-high vacuum electron microscopy: Growth of SiGe on Si", Annu. Rev. Mater. Sci., vol. 30, 2000, pp. 431-449; and K. Brunner, "Si/Ge nanostructures", Rep. Prog. Phys. vol. 65, No. 1, January 2002, pp. 27-72.

From a synthesis viewpoint, the two most commonly used techniques for the heteroepitaxial growth of $Si_{1-x}Ge_x$ on Si, are molecular beam epitaxy (MBE) utilizing solid Si and Ge sources, and ultrahigh vacuum chemical vapor deposition (UHV-CVD) or gas-source MBE utilizing common hydrides such as silane ($SiH_4$) and germane ($GeH_4$) or disilane ($Si_2H_6$) and digermane ($Ge_2H_6$). Such growth by MBE is described in more detail in J. C. Bean, L. C. Feldman, A. T. Fiory, S. Nakahara and I. K. Robinson, "$Ge_xSi_{1-x}$/Si strained-layer superlattice grown by molecular-beam epitaxy", J. Vac. Sci. Technol. A, vol. 2, No. 2, 1984, pp. 436-440. Growth by gas source MBE is described in more detail by D. W. Greve, "Growth of epitaxial germanium-silicon heterostructures by chemical vapour deposition", Mat. Sci. Eng. B, vol. 18, No. 1, February 1993, pp. 22-51.

There are two main objectives for developing these materials on Si wafers. The first is the formation of strained, defect-free $Si_{1-x}Ge_x$ films, which may take the form of strained layer superlattices, as described by J. C. Bean, L. C. Feldman, A. T. Fiory, S. Nakahara and I. K. Robinson, "$Ge_xSi_{1-x}$/Si strained-layer superlattice grown by molecular-beam epitaxy", J. Vac. Sci. Technol. A, vol. 2, No. 2, 1984, pp. 436-440. The second is the growth of coherent islands and quantum dots. Until very recently the focus has been concentrated on growth of Si-rich systems which are used for the fabrication of high speed electronics integrated with Si. The Ge-rich analogs are much less developed in spite of their great potential in future generations of optoelectronic devices including multi quantum well emitters, photodetectors, sensors and high-speed modulators covering a wide range of IR wavelengths, including the communications wavelength of 1.55 μm. See U. Konig and F. Schaffler, "P-type Ge channel MODFETS with high transconductance grown on Si substrates", IEEE Electron Device Lett., vol. 14, No. 5, April 1993, pp. 205-207.

Fabrication of $Si_{1-x}Ge_x$ alloys across the entire compositional range is highly desirable to achieve comprehensive band gap and strain engineering in the Si—Ge system. Materials with Ge rich concentrations are particularly desirable for the development of virtual substrates and buffer layers on Si for numerous device applications based on strained group IV materials and for integration of III-V and II-VI optical semiconductors with Si electronics.

$Si_{1-x}Ge_x$ layers with strain-free microstructure and variable compositions and lattice constants are currently used in industrial processes as virtual substrates for growth of high mobility electronic devices based on strained Si and Ge films (channels). See M. T. Currie, S. B. Samavedam, T. A. Langdo, C. W. Leitz, and E. A. Fitzgerald, "Controlling threading dislocation densities in Ge on Si using graded SiGe layers and chemical-mechanical polishing", Appl. Phys. Lett., vol. 72, No. 14, April 1998, pp. 1718-1720. By introducing a tensile in-plane strain in the Si channel, the electron and hole mobilities of Si can be dramatically enhanced in conventional complementary metal on oxide semiconductor (CMOS) field effect transistors. The standard material stack for strained Si CMOS devices incorporates a bulk Si (or SOI) substrate, a thick $Si_{1-x}Ge_x$ buffer layer (with a single composition, or graded linearly or in steps, or with multiple compositions) and a thin tensile-stressed Si channel layer, typically 100-500 Å thick. See P. M. Mooney and J. O. Chu, "SiGe Technology: Heteroepitaxy and High-Speed Microelectronics", Annu. Rev. Mater. Sci., vol. 30, 2000, pp. 355-362. CMOS devices are subsequently built on top of the strained Si channel using conventional CMOS processing. $Si_{1-x}Ge_x$ buffer layers with high Ge content (x=0.50-0.70) are needed to achieve high mobilities in strained Si channels grown on these buffer layers. The mobilities increase monotonically with increasing x and become three times higher than that of bulk Si for x=0.70, as described by M. L. Lee, and E. A. Fitzgerald, "Hole mobility enhancements in nanometer-scale strained-silicon heterostructures grown on Ge-rich relaxed $Si_{1-x}Ge_x$", J. Appl. Phys. vol. 94, November 4, August 2003, pp. 2590-2596. High mobility strained Si and Ge are used in high performance field-effect transistors (FET) and bipolar transistors. Extremely high mobility p-channel modulation-doped FETs have been demonstrated in heterostructures involving compressively strained Ge layers grown on Ge-rich $Si_{1-x}Ge_x$. See U. Konig and F. Schaffler, "P-type Ge channel MODFETS with high transconductance grown on Si substrates", IEEE Electron Device Lett., vol. 14, No. 5, April 1993, pp. 205-207; R. Hammond, S. J. Koester, and J. O. Chu, "High-performance 0.1 mu m gate-length Ge/Si0.4Ge0.6 p-channel MODFETs", Electron. Lett. vol. 35, No. 18, September 1999, pp. 1590-1591.

The $Si_{1-x}Ge_x$ buffer layers and virtual substrates need to fulfill a number of materials requirements such as low dislocation densities, low surface roughness as well as uniformity of strain, Ge content, and layer thickness. Low surface roughness and reduced threading defect densities are particularly important to ensure a uniform spatial stress distribution in the Si and Ge overlayer channels, and to prevent interface scattering which can compromise the strained-enhanced carrier mobility. The Ge-rich $Si_{1-x}Ge_x$ films, as grown on Si under conventional temperatures, however, possess high dislocation densities and surface roughness, due to the large lattice mismatch between the films and the substrate. See M. T. Currie, S. B. Samavedam, T. A. Langdo, C. W. Leitz, and E. A. Fitzgerald, "Controlling threading dislocation densities in Ge on Si using graded SiGe layers and chemical mechanical polishing", Appl. Phys. Lett. 72, 1718 (1998). Surface roughness in these systems can develop either through strain relaxation or as a result of non-uniform mass distribution on the surface, which in turn can promote dislocation formation at localized regions with high stress.

Previously known synthetic strategies for development of smooth $Si_{1-x}Ge_x$ buffer layers on Si are based on growth of thick compositionally graded films in which the Si and Ge content in the buffer layer is varied up to 100% Ge. The misfit strain between the $Si_{1-x}Ge_x$ epilayer and Si substrate is gradually relieved with increasing film thickness, as described by Y. J. Mii, Y. H. Xie, E. A. Fitzgerald, D. Monrow, F. A. Thiel, B. E. Weir, and L. C. Feldman, "Extremely high electron-mobility in $Si/Ge_xSi_{1-x}$ structures grown by molecular-beam epitaxy", Appl. Phys. Lett. vol. 59, No. 13, September 1991, pp. 1611-1613; P. M. Mooney, J. L. Jordan-Sweet, K. Ismail, J. O. Chu, R. M. Feenstra, and F. K. LeGoues, "Relaxed $Si_{0.7}Ge_{0.3}$ buffer layers for high-mobility devices", Appl. Phys. Lett. vol. 67, No. 16, October 1995, pp. 2373-2375, and M. T. Currie, S. B. Samavedam, T. A. Langdo, C. W. Leitz, and E. A. Fitzgerald, Appl. Phys. Lett. 72, 1718 (1998). Typically, an average grading rate of 10% Ge/μm is employed over the entire SiGe layer thickness. As described by M. T. Currie, et al., for a 50% Ge concentration a layer thickness of 5-10 μm is required to achieve material having dislocation densities of $6 \times 10^6$ cm$^{-2}$ and surface roughness with RMS values of ~30 nm. For Ge contents higher than 50% the defect densities and film roughness become much worse due to the increase in the lattice mismatch. This requires an even greater film thickness to achieve acceptable defect densities and a chemical-mechanical polishing (CMP) step to smoothen the surface before growing additional device structures. The resulting extreme film thickness and the CMP step make processing of the devices very expensive and in some cases even create additional problems such as degradation of key film properties.

An alternative approach has been reported to produce $Si_{1-x}Ge_x$ buffer layers on Si substrates via solid source MBE. This approach is described by K. K. Linder, F. C. Zhang, J.-S. Rieh, P. Bhattacharya, and D. Houghton, "Reduction of dislocation density in mismatched SiGe/Si using a low-temperature Si buffer layer", Appl. Phys. Lett. vol. 70, No. 24, June 1997, pp. 3224-3226. In this method, a low temperature nucleation layer of pure Si is deposited directly on the substrate surface at 400° C. Next, a series of distinct $Si_{1-x}Ge_x$ epilayers with sequentially increasing Ge fractions is grown on the Si buffer layer. These are ultimately utilized as templates for growth of Ge-rich and strain free top layers, which display low surface roughness and reduced defect densities (~$5 \times 10^6$/cm$^2$). See C. S. Peng, Z. Y. Zhao, H. Chen et al., "Relaxed $Ge_{0.9}Si_{0.1}$ alloy layers with low threading dislocation densities grown on low-temperature Si buffers", Appl. Phys. Lett. vol. 72, No. 24, June 1998, pp. 3160-3162. There are disadvantages to this approach, however, including use of a multi-step complicated procedure involving growth of several to many layers (depending on Ge concentration) and the use of MBE techniques which are not viable for cost-effective large-scale applications in commercial Si—Ge based technologies.

It is an objective of the present invention, therefore, to provide a straightforward, cost effective method that produces Si—Ge heterostructures with high Ge contents on Si substrates.

It is yet another object of this invention to provide a low temperature method that yields Si—Ge films with high Ge contents on Si substrates.

It is still another object of the present invention to provide a semiconductor structure having thin buffer layers grown directly on Si, which layers display planar surface morphologies, low densities of threading defects (less that $10^5$-$10^6$/cm$^2$), strain free microstructure, sharp and well-defined interfaces and homogeneous elemental profiles at the atomic level.

It is yet another object of the present invention to provide high Ge content Si—Ge/Si heterostructures suitable for application in IR optoelectronics as well as SiGe films on low temperature substrates for applications in photovoltaics and flexible displays.

Additional objects and advantages of the invention will be set forth in the description that follows, and in part will be apparent from the description, or may be learned by practice of the invention. The objects and advantages of the invention may be realized and obtained by means of the instrumentalities and combinations pointed out in the appended claims.

SUMMARY

To achieve the foregoing objects, and in accordance with the purposes of the invention as embodied and broadly described in this document, we provide a low-temperature method for depositing an epitaxial layer comprising Si—Ge on a substrate in a chemical vapor deposition (CVD) or gas source MBE chamber. The method includes introducing into the chamber a gaseous precursor comprising $(H_3Ge)_xSiH_{4-x}$, wherein x=1, 2, 3 or 4, under conditions whereby a layer comprising a Si—Ge material is formed on the substrate. The method includes introducing near the surface of the substrate the gaseous precursor comprising $(H_3Ge)_xSiH_4$, and dehydrogenating the precursor under conditions whereby the epitaxial $SiGe_x$ is formed on the substrate. The gaseous precursor can be introduced in pure form or intermixed with an inert carrier gas. Suitable inert carrier gases include $H_2$ and $N_2$. The gaseous precursor can be deposited by low pressure CVD, UHV-CVD or gas source MBE and can be introduced at relatively low temperature in a range, from about 250° C. to about 700° C., and at a pressure in a range from about $1 \times 10^{-7}$ Torr to at least about 5 Torr. The gaseous precursor can be introduced as a single gas source or as a mixture comprising $(H_3Ge)_xSiH_{4-x}$ and a germanium hydride, a silicon hydride or a silicon hydride-halide.

The method can be used to deposit on a substrate a layer comprising an epitaxial Si—Ge material formed as a strained or strain free layer having a planar surface or as coherent islands or quantum dots. According to one aspect of the invention, a semiconductor structure can be grown having a substrate and the Si—Ge material formed as a $SiGe_x$ layer, wherein x=1, 2, 3 or 4. The substrate can be a silicon substrate, such as Si(100). The SiGe, layer can be formed as a strained or strain free layer having a planar surface or it can be formed as quantum dots or coherent islands. The SiGe, layer can have an atomically planar surface morphology, a thickness less than one micron and a threading defect density of less than $10^5/cm^2$. The Si—Ge layer can be doped with an element selected from the group consisting of boron, arsenic, phosphorus, antimony and an indium. The silicon substrate can be patterned to form a template for selective growth of semiconductors.

The method of our invention provides a new low-temperature growth process leading to Ge-rich films with low defect concentrations and smooth surfaces. At the low deposition temperatures the mobility of Ge on the growth surface is much lower, thereby preventing mass segregation which in turn can lead to compositional and strain variations in the film. In addition, the mass segregation of dopants is negligible at low temperatures, which is particularly beneficial for development of devices that require layers with low thickness. The deposited Si—Ge materials possess the required morphological and microstructural characteristics for applications in high frequency electronic and optical systems, as well as templates and buffer layers for development of commercial devices based on high mobility Si and Ge channels. They can circumvent the need for previously-known compositionally graded $Si_xGe_{1-x}$ buffer layers and lift off technologies by providing suitable SiGe layers having a uniform composition throughout the layer.

BRIEF DESCRIPTION OF THE DRAWINGS

The accompanying drawings, which are incorporated in and constitute a part of the specification, illustrate the presently preferred methods and embodiments of the invention and, together with the general description given above and the detailed description of the preferred methods and embodiments given below, serve to explain the principles of the invention.

DESCRIPTION

Reference will now be made in more detail to the presently preferred methods and embodiments of our invention, as illustrated in the accompanying drawings. While we will describe our invention more fully with reference to these examples and drawings, the invention in its broader aspects is not limited to the specific details, representative devices, and illustrative examples shown and described. Rather, the description which follows is to be understood as a broad, teaching disclosure directed to persons of ordinary skill in the appropriate arts, and not as limiting upon our invention.

We have developed a novel method for growing epitaxial Si—Ge heterostructures on Si(100) with Ge-rich contents (Ge>50 at. %) and precise stoichiometries SiGe, $SiGe_2$, $SiGe_3$ and $SiGe_4$. The method of our invention utilizes new unimolecular hydrides with direct Si—Ge bonds derived from the family of compounds $(H_3Ge)_xSiH_{4-x}$ (x=1-4) as precursors. According to one important aspect of our invention, we have grown uniform, relaxed and highly planar films with low defect densities at unprecedented low temperatures between 300-450° C., circumventing entirely the need of thick compositionally graded buffer layers and lift off technologies. According to another important aspect of the invention, we have grown, at temperatures between 500-600° C., Si—Ge quantum dots with narrow size distribution, defect-free microstructures and highly homogeneous elemental content at the atomic level. A major advantage of the method of our invention over conventional routes is the precise control of morphology, composition, structure and strain via the incorporation of the entire Si/Ge framework of the gaseous precursor into the film.

Figure 1:
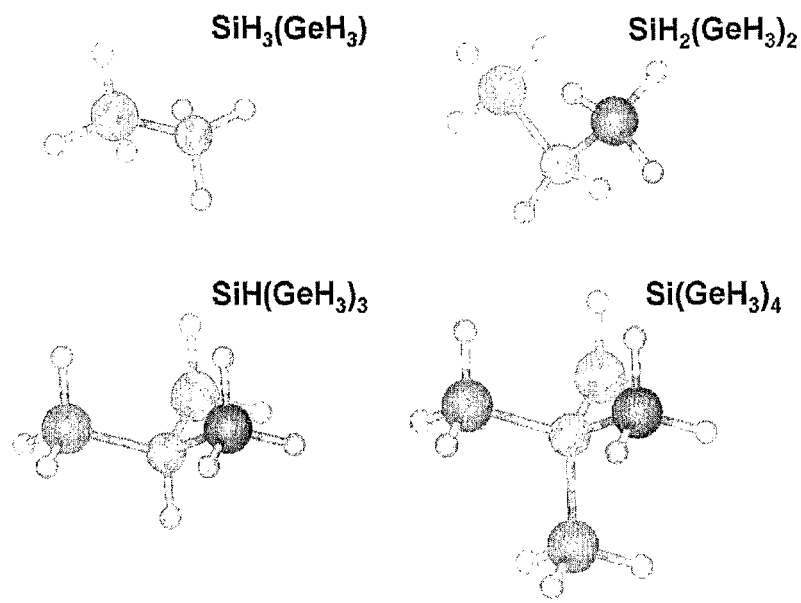
FIG. 1 shows molecular structures of the precursors $(GeH_3)_xSiH_4$-x, with x=1, 2, 3 and 4, which are used to grow epitaxial Ge-rich films on Si substrates according to the present invention.

FIG. 1 shows structures of the molecular precursors $(H_3Ge)_xSiH_{4-x}$ with x=1, ..., 4. These structures are derived from analytical and spectroscopic data and are confirmed by first principle simulations, as described in PCT Patent Application No. PCT/US04/43854, filed on Dec. 31, 2004, entitled "Hydride Compounds with Silicon and Germanium Core Atoms and Method of Synthesizing Same," which is incorporated herein in its entirety by this reference. These molecules, $H_3GeSiH_3$, $(H_3Ge)_2SiH_2$, $(H_3Ge)_3SiH$ and $(H_3Ge)_4Si$, are obtained in high-purity yields via straightforward synthetic methodologies utilizing commercially available starting materials, also as described in PCT Patent Application No. PCT/US04/43854. Their high volatility and facile reactivity make them particularly useful as precursors in low temperature (300-450° C.) film growth. In accordance with our invention, we conducted depositions of these compounds by gas source MBE, low pressure CVD, and UHV-CVD with only a single gas source. These depositions yielded well-defined concentrations corresponding to the Si—Ge content of the precursors. A notable result is the precise control of the composition at the atomic level via incorporation of the entire Si/Ge framework of the precursor into the film at unprecedented low growth temperatures (300° C.-450° C.).

Targeted deposition experiments of the precursor compounds have been conducted in the temperature range of about 300-700° C. to delineate the parameter space for growth of device quality films and quantum dots directly on silicon substrates. As discussed in more detail below, the films are obtained in the low temperature range and fulfill crucial requirements as suitable candidates for development of lattice engineered "virtual substrates" on Si. Potential applications include integration of strained Si and Ge channel devices on silicon exhibiting extremely high electron and hole mobilities. In the high temperature range, depositions of the precursors yield assemblies of three-dimensional coherently strained islands (quantum dots) reflecting the stoichiometry of the precursor in all cases without any segregation of either Ge or Si Depositions of $H_3GeSiH_3$, $(H_3Ge)_2SiH_2$, $(H_3Ge)_3SiH$ and $(H_3Ge)_4Si$ at 450° C., 400° C., 350° C. and 300° C., respectively, produced exclusively relaxed films with SiGe, $SiGe_2$, $SiGe_3$ and $SiGe_4$ concentrations, respectively. The low growth temperatures prevent surface segregation of the Si and Ge elements resulting in highly uniform compositional and strain profiles at the atomic level. The incorporation of the entire Si—Ge molecular core facilitates formation of relatively uniform bonding arrangements over the entire crystal, leading to relaxed films with planar surface morphology (no surface ripples).

The material morphology in our films (smooth films vs. rough films and islands) can be controlled by the adjustment of a single parameter, i.e. the growth temperature at a given flux rate of the unimolecular source. As previously mentioned, depositions of the precursors at 300° C.-450° C. produce exclusively relaxed layers with planar surfaces. FIGS. 2, 5, 8 and 10 show exemplary films of SiGe (partially relaxed), $SiGe_2$, $SiGe_3$ and $SiGe_4$, respectively, grown according to the invention. The layers obtained using the method of our invention at deposition temperatures in a range of 300° C.-450° C. are of much higher quality than those with comparable thickness and compositions previously obtained using conventional sources under similar conditions. Our films display low threading defect densities with the bulk of the defects concentrated at the Si interface. They grow strain free and highly planar, circumventing entirely the need for graded compositions or lift-off technologies and post-growth chemical mechanical polishing to smoothen their surface. Highlights of the successful fabrication of these films include: (i) unprecedented low temperature synthesis (300° C.-450° C.), (ii) atomically smooth and defect-free surface morphology (mismatch induced defects are primarily concentrated at the interface), (iii) strain-free microstructure, and (iv) excellent thermal stability of layer planarity. These materials therefore fulfill the crucial requirements as suitable candidates for development of lattice engineered "virtual substrates" with lattice parameters in the 5.5 Å to 5.65 Å range. Immediate applications of these virtual substrates include integration of strained Si and Ge channel devices on silicon exhibiting extremely high electron and hole mobilities. We anticipate that these will lead to important applications in state-of-the-art high performance field-effect transistors (FET) and bipolar junction transistors as well as novel photonic devices based entirely on group IV materials.

Figure 12:
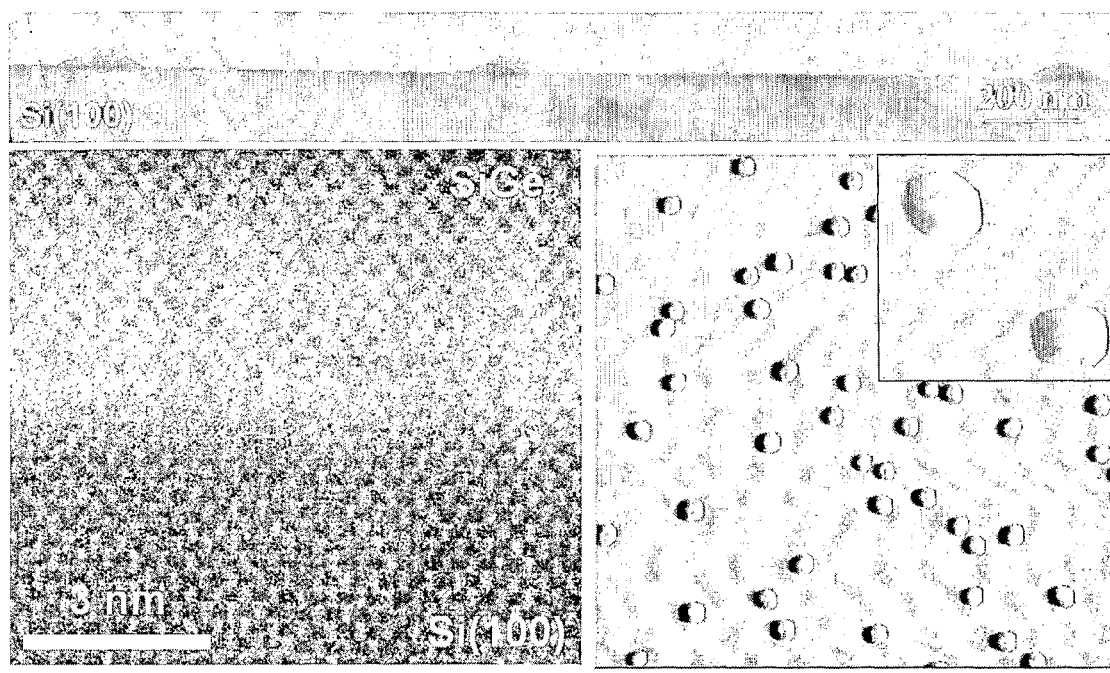
FIG. 12 is a set of micrographs showing $SiGe_3$ quantum dots grown on Si(100) according to the invention, including: (top) a bright field XTEM micrograph showing the highly coherent (no threading defects) $SiGe_3$ quantum dots of uniform size; (bottom left) a high-resolution Z-contrast image of the interface region showing perfect epitaxial alignment as well as a sharp and uniform interface; and (bottom right) an AFM image showing an ensemble of dome-shaped islands with a narrow size distribution and including an inset enlarged view showing the faceted islands.

Depositions of the $H_3GeSiH_3$, $(H_3Ge)_2SiH_2$, $(H_3Ge)_3SiH$ and $(H_3Ge)_4Si$ precursors above 500° C. produce self-assembled quantum dots and strained islands with narrow size distributions and highly uniform compositions reflecting the stoichiometry of the precursor in all cases without any segregation of either Ge or Si. The growth of the dots proceeds via the Stranski-Krastanov mechanism. The areal density and size distribution of the dots is controlled by simple adjustments of the flux rate of the precursor and the growth temperature, respectively. FIG. 12 shows an exemplary set of $SiGe_3$ quantum dots grown according to the invention at 600° C.

Growth of $SiGe_x$ Layers on Silicon

We conducted growth of Si—Ge films on Si(100) substrates in a UHV-CVD chamber equipped with a low-energy electron microscope (LEEM) for in situ real time observation of the growth process. The base pressure of the chamber was $2\times10^{-10}$ Torr. Film growth was obtained by exposing the substrate surface to the gaseous precursor admitted via a leak valve. Partial pressures in the $10^{-7}$ and $10^{-6}$ Torr range were used for deposition. The flux of the precursor was delivered via a glass inlet tube, which passed through the apertures in the objective lens of the LEEM. The inlet tube was positioned at 2.5 cm from the substrate at an angle of 16° to its surface. The substrates were p-type Si(100) (ρ~50 Ωcm) and were prepared for epitaxy by repeated flashing at 1240° C. to vaporize the native oxide layer from the substrate surface. Heating of the substrate was provided via electron bombardment from a heated filament on the backside of the sample.

We also conducted deposition reactions of the $(H_3Ge)_xSiH_{4-x}$ compounds in a gas source MBE chamber with base pressure of $2\times10^{-10}$ Torr. Again, the Si(100) substrates were prepared for epitaxy by repeated flashing at 1240° C. to vaporize the native oxide layer. Film growth was obtained by exposing the substrate surface to the gaseous precursor at partial pressures in the range of $10^{-7}$-$10^{-6}$ Torr.

Figure 9:
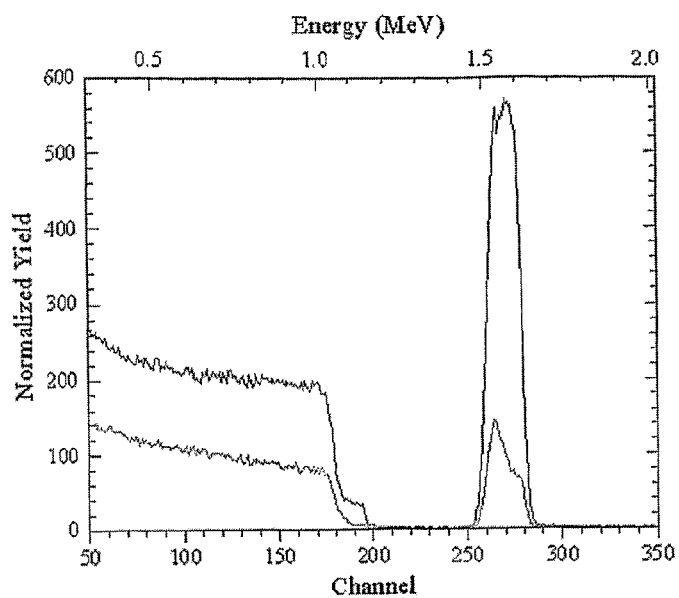
FIG. 9 shows RBS random (upper trace) and aligned (lower trace) spectra of a $SiGe_3$ (001) layer grown at 380° C. according to the invention.

Under these conditions the $H_3GeSiH_3$, $(H_3Ge)_2SiH_2$, $(H_3Ge)_3SiH$ and $(H_3Ge)_4Si$ compounds dissociated on the Si surface via complete $H_2$ elimination at 450, 400, 350 and 300° C., respectively, to produce films at growth rates of 2-3 nm/min. Rutherford backscattering (RBS) in random mode indicate film compositions of SiGe, $SiGe_2$, $SiGe_3$ and $SiGe_4$, respectively, in agreement with the elemental content of the Si/Ge framework of the corresponding precursors. The RBS channeled spectra show that the Si and Ge atoms in the structure channeled remarkably well despite the low growth temperature, which is consistent with monocrystalline materials in epitaxial alignment with the Si substrate. As a representative example, FIG. 9 compares RBS random and channeled spectra for a SiGe$_3$ film grown on Si(100) at 380° C. As in the example of FIG. 9, in most samples the ratio of the aligned versus the random peak heights ($\chi_{min}$), which measures the degree of crystallinity across the layer, was relatively low typically ranging from 30% at the interface to 7% near the surface. The decrease of the $\chi_{min}$ value across the layer thickness suggests that most of the defects are concentrated near the interface region. This was clearly established by cross-sectional transmission electron microscopy (XTEM). The bright field XTEM images in <110> projection show common threading dislocations propagating along the (111) lattice planes. Nevertheless, the bulk of these defects annihilated at 60-degree angles within 10 nm from the film interface (see FIG. 5). The upper portion of the film is relatively free of threading defects particularly those penetrating to the top surface. In addition, phase and Z-contrast high-resolution XTEM images showed sharp and well defined interfaces with perfectly epitaxial microstructures in which the (111) lattice planes of the film and the substrate are completely commensurate. The surface morphology of the films was examined by atomic force microscopy (AFM) scans. The films possess highly planar surfaces even in the 100-500 nm thickness range, which considerably exceeds the expected critical thickness. The AFM RMS values range between 0.5-1 nm for typical 25 µm×25 µm areas. In addition the surface planarity was found to be thermally stable up to 750° C.

Raman and high resolution X-ray diffraction (XRD) were used to investigate the structural, bonding and strain properties of all films. In particular, the Raman spectra of the SiGe$_2$, SiGe$_3$ and SiGe$_4$ materials showed that the films are fully relaxed. X-ray reciprocal space maps of the (224) and (004) reflections were used to measure the lattice constants normal and parallel to the interface plane. These were virtually identical in most samples indicating a lack of strain distortion from perfect cubic symmetry. In addition the x-ray data indicated highly aligned heterostructures with mosaics spreads as low as 0.1 degrees. In contrast to SiGe$_x$ (x=2, 3, 4), the SiGe alloys possessed substantial residual strain. The x-ray reciprocal space map measurements showed an elongation along the "c" direction consistent with a tetragonal distortion. The calculated strain was in the 60-70% range. Remarkably similar strain values were determined from Raman shifts of the Si—Si, Si—Ge and Ge—Ge phonon modes. Raman was used to investigate the distribution of strain in these SiGe layers, by measuring the phonon frequencies using laser lines with different penetration depths. The results showed that the Raman peaks did not change with depth indicating that the strain does not vary across the layers. Collectively, the characterization of our Si—Ge materials revealed growth of crystalline, highly epitaxial, smooth, continuous and uniform alloy layers with Ge-rich concentrations and uniformly stressed or strain-relaxed microstructures. A key to the successful synthesis of our films is the unprecedented low growth temperatures which reduce surface mobility of the Si and Ge atoms and prevent mass segregation thereby resulting in highly uniform compositional and strain profiles at the atomic level. In addition, the incorporation of the entire Si—Ge molecular core promotes the formation of exceptionally uniform bonding arrangements over the entire crystal, leading to relaxed films with planar surface morphology (no surface ripples).

In the high temperature regime of the investigated temperature range, we observe exclusive growth of self-assembled islands, or quantum dots. Presumably these form spontaneously during the epitaxial growth of Si—Ge on Si as a means of relieving the strain caused by the mismatch between the larger Si—Ge lattice and the smaller lattice of the Si substrate. In our experiments the islands first appear after the formation of a flat wetting layer ~3-5 monolayers thick. The morphology distribution and size of the islands were examined by AFM and XTEM. FIG. 12 shows a representative AFM image of islands grown at 600° C. using (H$_3$Ge)$_2$SiH$_2$. The islands are primarily dome-shaped and reasonably uniform in size with an approximate density distribution of ~3×10$^8$ cm$^2$. The bright field XTEM micrographs showed ensembles of coherent islands with defect free microstructure and with a narrow size distribution. The microstructural properties of the islands were explored via Z-contrast imaging performed on a JEOL 2010F. These experiments confirmed the presence of distinct islands grown on the substrate surface via a wetting layer of uniform thickness as shown for a representative sample produced by (H$_3$Ge)$_3$SiH. Note that in Z-contrast images the intensity is proportional to Z$^{1-7}$, consequently the Ge containing islands as well as the wetting layers appear considerably brighter than the underlying Si.

FIG. 12 is also representative of the most commonly found quantum dot microstructure showing a perfectly sharp and uniform interface. The highly coherent nature (no defects are observed) of the quantum dots grown by our method is confirmed by the Raman spectra, which show that the islands are highly strained, as expected due to the lattice mismatch of the dots with the substrate. We used RBS and electron energy loss spectroscopy (EELS) at 1.7 Å resolution to determine the dot stoichiometry and elemental homogeneity. The compositions of the islands were found to be SiGe$_2$, SiGe$_3$ and SiGe$_4$, reflecting the stoichiometries of the unimolecular precursors (H$_3$Ge)$_2$SiH$_2$, (H$_3$Ge)$_3$SiH and (H$_3$Ge)$_4$Si, respectively, used for growth. EELS compositional profiles across the dots revealed remarkably uniform elemental distributions at the nanometer scale. An important advantage with regard to composition is that there is no apparent mixing of the elements across the interface as is typically observed when pure Ge islands are grown on Si at T>550° C. This type of Si interdiffusion from the substrate into Ge islands represents the most commonly reported method to form Si—Ge quantum dots on Si with Ge>50 at. %. Unfortunately, this interdiffusion of the elements depletes the Si at the base of the islands to form a trench several nanometers in depth. In addition, the Si/Si—Ge dot interface is no longer distinct. A wide and blurred transition region with a graded composition develops across the original interface. Substantial gradients of concentration are also found in the vertical direction across the entire dot. Our single source approach circumvents these difficulties.

Activation Energy Measurements of (H$_3$Ge)$_x$SiH$_{4-x}$

The decomposition profiles of H$_3$GeSiH$_3$, (H$_3$Ge)$_2$SiH$_2$, (H$_3$Ge)$_3$SiH and (H$_3$Ge)$_4$Si to form the corresponding SiGe, SiGe$_2$, SiGe$_3$ and SiGe$_4$ films were investigated using LEEM. In particular, the activation energy with respect to H$_2$ desorption from the substrate surface was determined for each of the compounds by measuring the growth rate vs. temperature for a single Si—Ge monolayer. The activation energies for the Si—Ge molecules were compared to that measured for digermane. The data indicate that (H$_3$Ge)$_2$SiH$_2$, (H$_3$Ge)$_3$SiH and (H$_3$Ge)$_4$Si display reactivities remarkably similar to that of digermane and thereby favor very low temperature deposition routes comparable to digermane.

Figure 3:
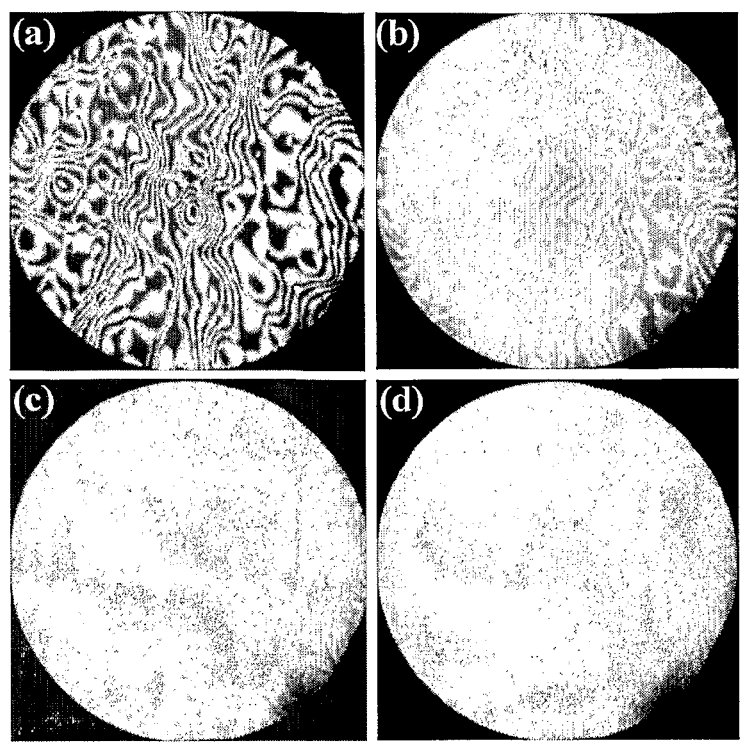
FIG. 3 is a set of low-energy electron microscopy (LEEM) images showing layer-by-layer growth of $SiGe_2$ on Si(100) according to the invention, including images showing: (a) the morphology of a clean surface; (b) deposition of the first layer; (c) the second layer; and (d) the third layer.

The initial layer-by-layer growth of the compounds was monitored in situ by LEEM. Video images were taken over a field of view of 8 μm on Si(100)-(2×1) using (½,0) diffraction beam. The (2×1) and (1×2) terraces, which are separated by single-height atomic steps, alternate in contrast from dark to bright under these conditions. This is due to the rotation of the dimer reconstruction across each step. FIG. 3 shows an exemplary sequence of LEEM images of SiGe$_2$ on Si(100) produced via CVD of SiH$_2$(GeH$_3$)$_2$, showing the layer-by-layer deposition. Referring to FIG. 3, image (a) shows the morphology of the clean Si surface, image (b) shows the deposition of the first fall monolayer, image (c) shows the second full monolayer, and image (d) shows the third full monolayer. The field of view is 8 μm. A contrast reversal in the (2×1) and (1×2) terraces is observed indicating a layer-by-layer growth. After the fourth monolayer the LEEM contrast became diffuse presumably due to new growth of incomplete layers.

Figure 4:
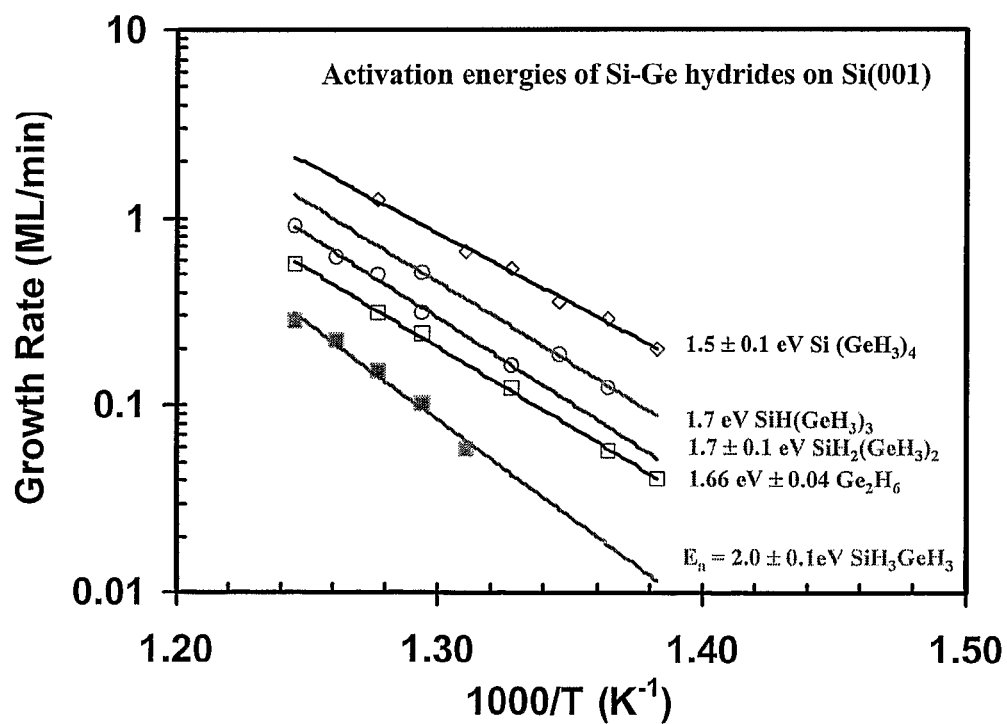
FIG. 4 is a graph showing the temperature dependence of the first layer growth rates for $SiH_3GeH_3$, $SiH_2(GeH_3)_2$, $SiH(GeH_3)_3$ and $Si(GeH_3)_4$ precursors according to the invention, as well as for $GeH_3GeH_3$ for comparison.
Figure 5:
FIG. 5 is an XTEM micrograph of a $SiGe_2$ layer grown on Si(100) according to the invention, showing that threading dislocations are concentrated at the interface region and do not propagate to the film surface, and that the layer is highly uniform in thickness and displays an atomically smooth and continuous surface morphology.

The average growth rate for the first layer as a function of temperature was measured in the LEEM to determine the activation energy of the Si—Ge hydride compound decomposition on Si(100). For comparison the activation energy of pure H$_3$GeGeH$_3$ was also determined using the same method. FIG. 4 is a graph showing plots of the temperature dependence of the first layer growth rates for H$_3$GeSiH$_3$, (H$_3$Ge)$_2$SiH$_2$, (H$_3$Ge)$_3$SiH and (H$_3$Ge)$_4$Si as well as for H$_3$GeGeH$_3$. The plots show growth rates for a range of temperatures from about 420° C. to about 540° C. and a gas pressure of about $1.0\times10^{-6}$ Torr. The data of FIG. 4 are consistent with the first-order H$_2$ desorption kinetics and yield activation energies of 2.0 eV, 1.7 eV, 1.7 eV and 1.5 eV, for H$_3$GeSiH$_3$, (H$_3$Ge)$_2$SiH$_2$, (H$_3$Ge)$_3$SiH and (H$_3$Ge)$_4$Si, respectively, and an activation energy of about 1.7 eV for H$_3$GeGeH$_3$. As can be seen from FIG. 4, the higher Ge content compounds clearly favor low temperatures routes comparable to pure digermane.

The straight line in FIG. 4 is characteristic of first-order desorption kinetics. The slope gives activation energies which are in good agreement with the activation energy values of 1.7 eV and 1.6 eV obtained previously for H$_2$ desorption from a pure Ge(100) surface, as described by G. Eres and J. W. Sharp, "Investigation of the kinetics of digermane chemisorption and reaction product desorption in thin film growth of germanium", J. Vac. Sci. Technol. A, vol. 11, No. 5, September-October 1993, pp. 2463-2471; and T. R. Bramblett, Q. Lu, N. E. Lee, N. Taylor, M. A. Hasan, and J. E. Greene, "Ge(001) gas-source molecular beam epitaxy on Ge(001)2×1 and Si(001)2×1 from Ge$_2$H$_6$-growth kinetics and surface roughening", J. Appl. Phys. vol. 77, No. 4, February 1995, pp. 1504-1513. A study of growth rate vs. temperature in the LEEM for the H$_3$GeSiH$_3$ compound gave an activation energy of 2.0 eV. This value is intermediate to our measured value of digermane (GeH$_3$)$_2$ (1.6 eV) and that reported for disilane (SiH$_3$)$_2$ (2.3 eV) by J. Takahashi, Y. Utsumi, H. Akazawa, I. Kawashima, and T. Urisu, "Synchrotron radiation excited Si epitaxial growth using disilane gas source molecular beam system", Appl. Phys. Lett. vol. 58, No. 24, June 1991, pp. 2776-2778. The 2.0 eV value appears to be reasonable since SiH$_3$GeH$_3$ is essentially a compositional hybrid of (SiH$_3$)$_2$ and (GeH$_3$)$_2$, i.e. (SiH$_3$)$_2$+(GeH$_3$)$_2$→2(SiH$_3$GeH$_3$).

The activation energy results reveal that the decomposition kinetics of the series (H$_3$Ge)$_x$SiH$_{4-x}$ (x=2-4) are remarkably similar to those of (GeH$_3$)$_2$ and suggest that these compounds are more reactive than either (SiH$_3$)$_2$ or H$_3$GeSiH$_3$. Accordingly they represent a unique low-temperature source to Ge rich Si—Ge alloys. The facile reactivity of (H$_3$Ge)$_2$SiH$_2$ (H$_3$Ge)$_3$SiH and (H$_3$Ge)$_4$Si pave the way to immediate development of SiGe semiconductors on specialty substrates that can withstand processing temperatures as high as 300° C., such as plastic substrates used for flexible displays.

EXAMPLES

The following examples help to further explain the invention. It will be understood, however, that the examples are illustrative of the invention and that the invention is not limited only to these examples.

Example

Growth of SiGe

The growth of SiGe layers was accomplished via gas source MBE with a precursor flux of $5\times10^{-5}$ Torr and at a temperature of 480° C. Above this temperature strained islands (quantum dots) were obtained rather than smooth layers. The films were examined ex situ by AFM, XRD, Raman scattering, RBS, and high-resolution XTEM. The elemental concentration, thickness and crystallinity of SiGe were determined by RBS. The random backscattering spectra indicate a film thickness ranging up to 100 nm and a Ge content of 50 at. % in agreement with the elemental content of the GeSi framework of the corresponding H$_3$GeSiH$_3$ precursor. The aligned spectra indicated highly crystalline material in epitaxial alignment with the substrate. AFM studies of films with 100 nm thickness, which exceeds considerably the expected critical thickness of a perfectly pseudomorphic SiGe, gave RMS values of ~1.6 nm for areas 10 μm×10 μm areas indicating planar surface morphologies. X-ray diffraction showed a single sharp peak corresponding the (004) reflection of the cubic structure. High resolution XRD, including reciprocal space maps of the (004) and (224) reflections revealed a partially strained layer in perfect epitaxial alignment with the substrate.

XTEM examinations confirm crystalline and highly epitaxial growth of smooth, continuous and uniform SiGe layers. TEM bright field images show that films with 100 nm thicknesses are free of threading dislocations. A systematic survey of samples showed no defects penetrating through the layers within a field of view of ~1.5 μm in TEM micrographs. The upper limit of threading dislocations in this case is less that $10^5$-$10^6$/cm$^2$ which is unusual for a material with 50 at. % Ge directly grown on Si.

High-resolution images reveal perfectly commensurate and monocrystalline SiGe/Si interfaces with virtually defect free microstructure. Occasional edge dislocations were observed (at steps on the substrate surface) spaced 100-150 nm apart with no dislocation cores penetrating to the top surface. These defects are parallel to the interface plane and are likely to alleviate the differential stress generated by the lattice mismatch between the film and the Si substrate. The presence of edge dislocation in these samples is surprising since SiGe-based materials typically display (111)-threading dislocations and stacking faults rather than planar defects. A plausible explanation is that the steps on the Si surface act as nucleation sites for the formation of these defects. The Raman spectra showed the three main features that correspond to the "Ge—Ge", "Si—Ge" and "Si—Si" lattice vibrations at frequencies 295.8 cm$^{-1}$, 414.3 cm$^{-1}$ and 497.7 cm$^{-1}$, respectively. These measured values are significantly blue shifted with respect to the expected positions for a strain free Si$_{0.50}$Ge$_{0.50}$ alloy, which are calculated to be at 293 cm$^{-1}$, 410.5 cm$^{-1}$ and 492.2 cm$^{-1}$, respectively. The Raman shifts indicate that there must be a substantial residual strain in the material. Analysis of data acquired using laser lines with variable penetration depths showed that the frequencies of the Si—Si, Ge—Ge and Si—Ge phonon modes are the same throughout indicating a uniform distribution of the strain in the layers.

Figure 2:
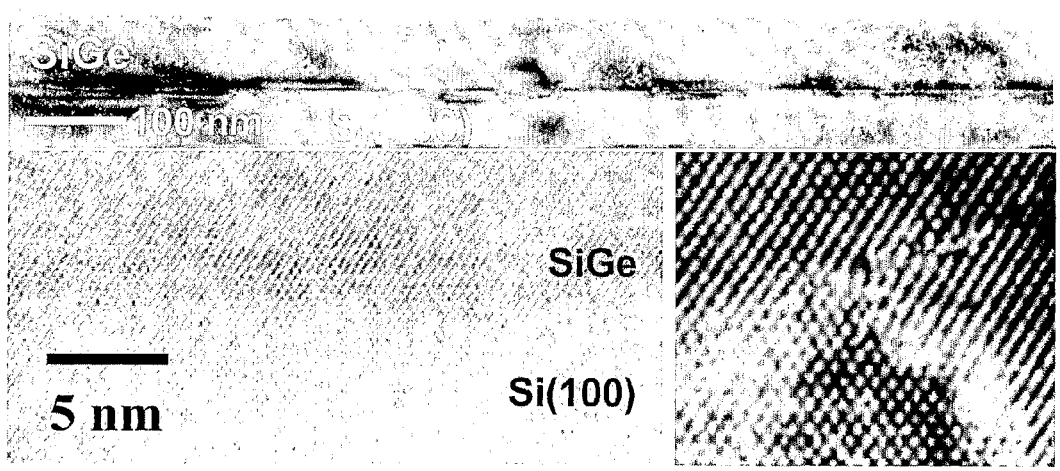
FIG. 2 is set of micrographs of a layer with a stoichiometric SiGe composition grown on Si(100) according to the present invention, including: (top) a bright field cross-sectional transmission electron microscopy (XTEM) micrograph of the entire layer thickness; (bottom left) a micrograph of the interface region showing perfect epitaxial alignment between Si(100) and SiGe; and (bottom right) a micrograph showing SiGe growth on a step at the interface in which an edge dislocation that is parallel to the interface plane is visible in the vicinity of the step.

FIG. 2 shows an example set of micrographs of a SiGe layer grown on a Si(100) substrate according to our invention. The top image of FIG. 2 is a bright field XTEM micrograph of the entire thickness of the SiGe layer, which shows the absence of threading defects within the field of view. The bottom left image shows the interface region having perfect epitaxial alignment between the Si(100) substrate and the SiGe layer. The bottom right image shows an edge dislocation close to a step region at the interface. These defects are typically located at a step on the Si surface and partially relieve the strain due to the mismatched Si and SiGe materials.

Example

Growth of $SiGe_2$

The growth of $SiGe_2$ (i.e., $Si_{0.33}Ge_{0.67}$) layers and quantum dots via gas source MBE was investigated in the temperature range of 400° C.-700° C. via dehydrogenation of $(H_3Ge)_2SiH_2$. The highest deposition temperature that yields continuous layers with perfectly planar surfaces is ~480° C. The typical growth rate at this temperature and $5\times10^{-6}$ Torr precursor pressure was ~3.5 nm/minute. As expected, the growth rate dropped to 1.0 nm/minute as the temperature was lowered to 450° C., and no appreciable growth was observed below 400° C. due to the reduced reactivity and sticking coefficient of the compound.

Figure 6:
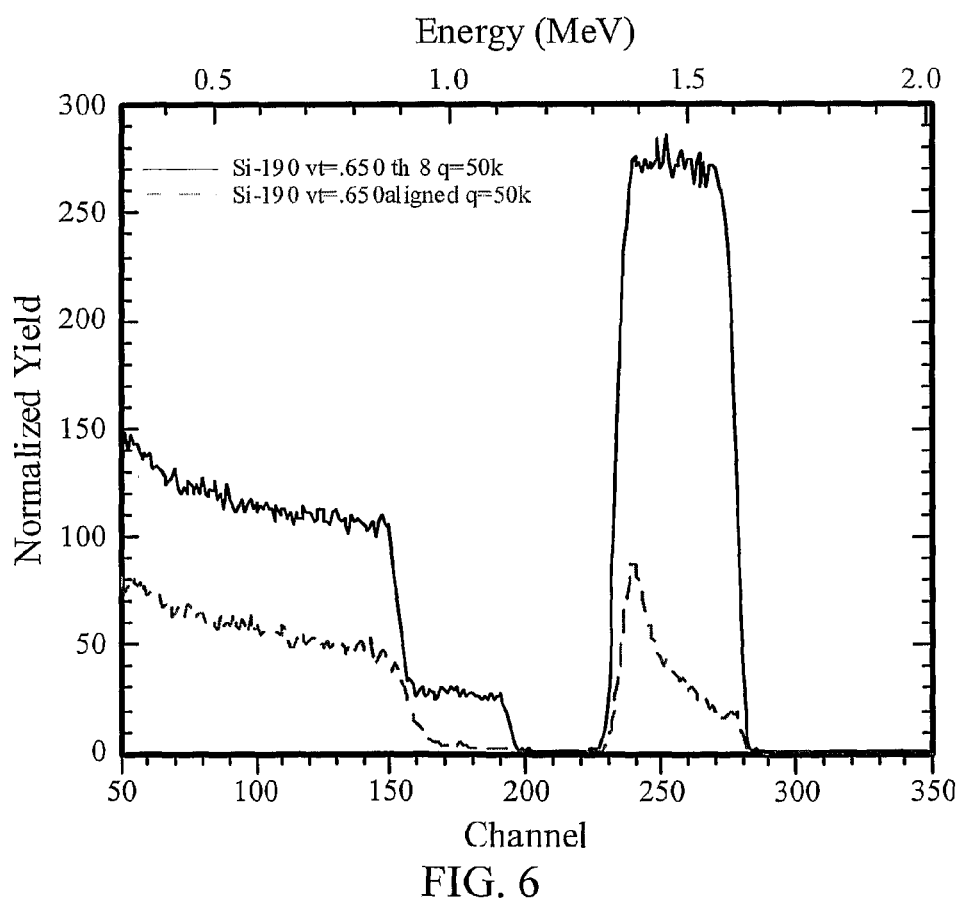
FIG. 6 shows Rutherford backscattering (RBS) random (upper trace) and aligned (lower trace) spectra of a 200 nm $SiGe_2$ film grown on Si(100) according to the invention.

The elemental concentration and film thickness of the $SiGe_2$ layers were determined by RBS in random mode. The crystallinity and epitaxial alignment were examined by ion channeling. FIG. 6 shows the random and aligned backscattering spectra for a sample grown at 480° C. having a film thickness of 400 nm and a Ge content of 67% in perfect agreement with the Ge content of the $Ge_2Si$ framework of the $(H_3Ge)_2SiH_2$ compound. The film concentration as measured by RBS is constant with film thickness. The ratio of the aligned versus the random peak heights ($\chi_{min}$), which measures the degree of crystallinity across the layer, is relatively low ranging from 27% at the interface to 7% near the surface. This indicates monocrystalline material in epitaxial alignment with the Si substrate. The much higher degree of dechanneling across the interface region, suggests that the majority of the defects are located in the lower portion of the film close to $Ge_2Si/Si$ boundary and the dislocation density is decreased with increasing the film thickness. This is confirmed by bright field XTEM images, which show that most of the threading defects annihilate within an area of 10 nm above the interface for a typical 200 nm-thick layer. FIG. 6 shows the RBS spectrum of 200 nm $SiGe_2$ film on Si(100). The sharp drop of the $\chi_{min}$ value from 27% at the interface to 7% at the surface illustrates that the defects concentration decreases dramatically with increasing the film thickness.

The XTEM images also show that the films are atomically flat which is confirmed by AFM images in contact mode. The as grown materials with thickness of 40 nm and 400 nm display RMS values of 0.4 nm and 1.2 nm, respectively, for areas in the range of $5\times5$ μm² to $10\times10$ μm². These RMS values are remarkably lower than those reported previously for compositionally graded techniques (~30 nm) as well as other MBE methods utilizing Si and SiGe nucleation layers (~2.4 nm).

Figure 7:
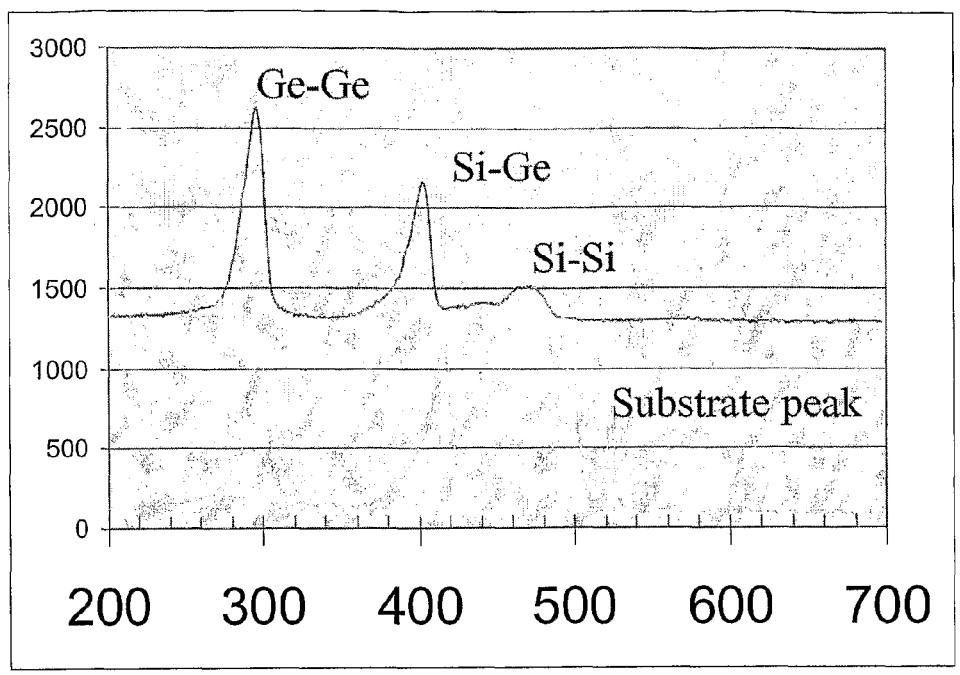
FIG. 7 shows Raman spectra of $SiGe_2$ (bottom) and $SiGe_3$ (top) showing the characteristic Ge—Ge, Si—Ge and Si—Si peaks indicating fully relaxed materials. The $SiGe_2$ spectrum (bottom) also includes an additional sharp peak corresponding to the Si substrate

X-ray θ-2θ diffraction measurements show a strong peak corresponding to the (004) reflection. In-plane rocking scans of the (004) reflection have a FWHM of 0.3° which is typical for this type of highly mismatched heteroepitaxy. The measured out-of-plane lattice constants $\alpha_\perp$ for $Si_{0.33}Ge_{0.67}$ layers with different thickness are listed in Table 1. Under the assumption of a tetragonal distortion for a SiGe layer deposited onto Si(100), the unstrained lattice parameter of the layer $\alpha_{SiGe}$ is related to the in-plane lattice parameter ($\alpha_{\parallel SiGe}$) and perpendicular lattice parameter ($\alpha_{\perp SiGe}$) by the relation $\alpha_{SiGe}=\alpha_\perp[1-2\nu(\alpha_\perp-\alpha_\parallel)/\alpha_\perp(1+\nu)]$ in which ν is the Poisson ratio of Si—Ge (0.27-0.28). The value of unstrained $Si_{0.33}Ge_{0.67}$ lattice parameter $\alpha_{SiGe}$ is calculated using $\alpha_{SiGe}=5.43105+0.2005x+0.0263x^2$, which gives $\alpha_{SiGe}=0.5581$ nm. The in-plane $\alpha_{\parallel SiGe}$ lattice constants for the films with different concentrations are listed in Table 1. Finally, the degree of in-plane strain relaxation R is given by $R=(\alpha_{\parallel SiGe}-\alpha_s)/(\alpha_{SiGe}-\alpha_s)$, where $\alpha_s=0.5431$ nm is the Si substrate lattice constant. Table 1 shows that a 40-nm-thick is almost relaxed at the degree of R=85%. The lattice constant of a 400-nm-thick $Si_{0.33}Ge_{0.67}$ layer is extremely close to the values of unstrained relaxed film. As shown in FIG. 7, the Raman spectrum of the $Si_{0.33}Ge_{0.67}$ films (bottom) shows the characteristic peaks corresponding to Ge—Ge (296 cm$^{-1}$), Si—Ge (407 cm$^{-1}$) and Si—Si (478 cm$^{-1}$) lattice vibrations. The peak positions are consistent with fully relaxed material.

TABLE 1

Summary of lattice constants and relaxation rate of SiGe epilayers

| films | in-plane (nm) | out-of-plane (nm) | unstrained (nm) | relaxation |
| --- | --- | --- | --- | --- |
| $Si_{0.50}Ge_{0.50}$ | 0.5504 | 0.5564 | 0.5538 | 68% |
| $Si_{0.33}Ge_{0.67}$ | 0.5585 | 0.5590 | 0.5588 | 97% |
| $Si_{0.25}Ge_{0.75}$ | 0.5562 | 0.5615 | 0.5592 | 81% |
| $Si_{0.20}Ge_{0.80}$ | 0.5599 | 0.5615 | 0.5608 | 95% |

Annealing experiments were performed to establish the thermal stability of the epilayers at temperatures between 480° C. and 750° C., a range well within actual device processing temperatures. The XRD lattice constant, the $\chi_{min}$ values of the RBS aligned spectra, and the AFM surface roughness were measured for the annealed samples and compared with the values of the as grown materials. Samples with a thickness of 400 nm do not show any increase in surface roughness (rms) even after annealing at 750° C. for 14 hours. This indicates that the planarity of the surface in our samples is thermally robust. The XRD and RBS aligned spectra demonstrated that there were no observable changes before and after annealing. This also confirms full relaxation in the as grown $Si_{0.33}Ge_{0.67}$ layers at 480° C. The annealing experiments showed no degradation or improvement of the quality of the as grown layers. They possess low threading dislocation densities, flat surfaces and are fully relaxed at a thickness less than 400 nm and display remarkable thermal stability up to at least 750° C.

Example

Growth of $SiGe_3$

Figure 8:
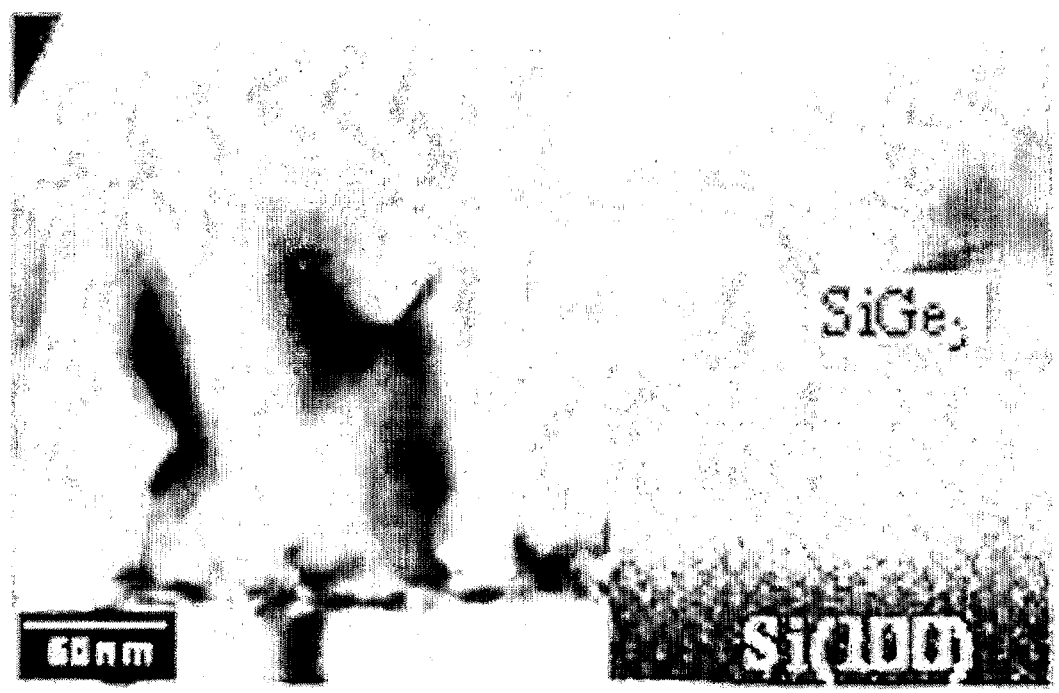
FIG. 8 is a bright field XTEM image of a strain-free and atomically smooth $SiGe_3$ layer grown on Si(100) according to the invention, with an inset atomic resolution Z-contrast image of the interface region showing a well defined, abrupt and perfectly epitaxial interface microstructure.

The growth of $SiGe_3$ (i.e., $Si_{0.25}Ge_{0.75}$) layers on Si(100) was conducted by thermal dehydrogenation of $(H_3Ge)_3SiH$ in the range of 350° C.-450° C. Strain-free layers with smooth surfaces (RMS 1.5-2.0 nm) and thickness up to 200 nm were deposited by gas source MBE and by low pressure CVD at T<400° C. Samples grown at T=450° C. were substantially thicker, in the 1 μm range, and displayed a relatively high surface roughness (RMS>5.0 nm). The growth rate at 450° C. was 0.1 μm per minute due to the exceptionally high reactivity of the compound even at these moderate growth temperatures. The composition of all samples as determined by RBS was consistently $Si_{0.25}Ge_{0.75}$ corresponding to the entire $SiGe_3$ molecular core of the precursor. XTEM showed that most dislocations originate at the interface and terminate within a 10 nm region above the interface. No threading defects penetrating to the film surface were observed in the bright field TEM micrographs. FIG. 8 shows an XTEM image of a strain-free and atomically smooth $SiGe_3$ layer grown on Si(100) according to our invention. As shown in FIG. 8, defects are concentrated in the lower portion of the layers and most annihilate within 10 nm above the interface.

The pile up of most defects at the interface was evident in the RBS channeling spectra. The typical $\chi_{min}$ value is approximately 20% at the interface decreasing rapidly to 7% near the top surface. FIG. 9 shows the RBS aligned spectrum of a $SiGe_3(001)$ layer grown at 380° C. The $\chi_{min}$ is 25% at the SiGe/Si interface and decreases to 9% at the surface. The sharp peak at the interface indicates high concentration of defects which annihilate toward the surface.

High-resolution images in phase contrast and Z-contrast modes (see FIG. 8) showed sharp and well defined interfaces with perfectly epitaxial microstructures in which the 111 lattice planes of the film and the substrate are completely commensurate. The inset of FIG. 8 is an atomic resolution Z-contrast image showing a well defined, abrupt and perfectly epitaxial interface microstructure. The Raman spectrum of the $Si_{0.25}Ge_{0.75}$ films (FIG. 7 top) displays the characteristic Ge—Ge, Si—Ge and Si—Si peaks and the corresponding frequencies indicate a fully relaxed material. The x-ray diffraction data provided further confirmation of strain free material growth in the $SiGe_3$ system. The experimental lattice parameters matched the theoretical values which were determined using Vegard's Law.

Example

Growth of $SiGe_4$

Figure 10:
FIG. 10 is a XTEM image showing the atomically flat top surface of a $SiGe_4$ film according to the invention.
Figure 11:
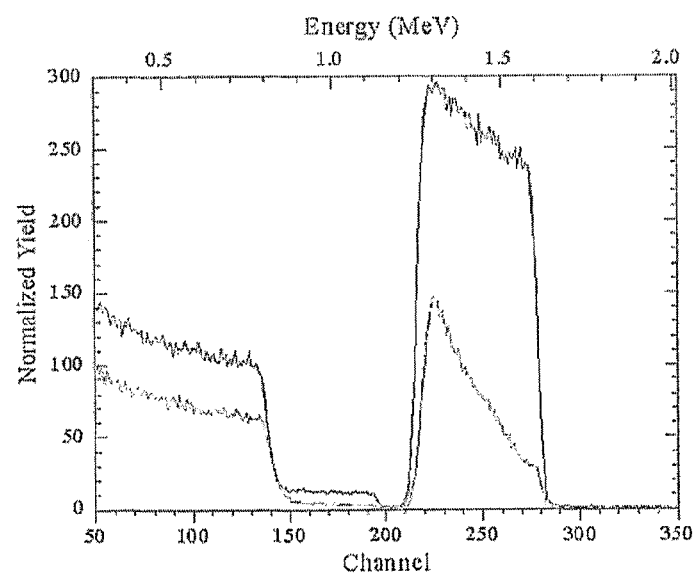
FIG. 11 shows RBS random (upper trace) and aligned (lower trace) spectra of a $SiGe_4$ (001) layer according to the invention with a thickness of 0.5 nm.

Growth of $SiGe_4$ (i.e., $Si_{0.20}Ge_{0.80}$) layers on Si(100) was conducted by thermal dehydrogenation via CVD and gas source MBE of $Si(GeH_3)_4$ at 380° C.-300° C. and $5\times10^{-6}$ Torr precursor pressure. Under these conditions smooth and uniform layers were obtained at reasonable growth rates of 2 nm/minute. The AFM RMS for all films were in the range of 1.0-1.5 nm for scans covering 5.0 μm×5.0 μm areas. FIG. 10 is an XTEM image showing the atomic flat top surface of $SiGe_4$ film. RBS analysis of layers with thickness up to 500 nm gave a $Si_{0.20}Ge_{0.80}$ elemental content, which reflects that of the $SiGe_4$ tetrahedral core of the precursor. FIG. 11 shows RBS random and aligned spectra (lower trace) of a $Si_{0.20}Ge_{0.80}$ (001) layer with a thickness of 0.5 μm. The ion channeling data suggested that the defects are predominately concentrated at the interface while the upper portion of the film is relatively defect free. The XTEM bright filed images confirmed the pile up of defects at the interface and revealed highly coherent layer thickness and perfectly planar surfaces (see FIG. 10). XRD analysis gave the expected Vegard's values for the lattice constants indicating strain free growth as expected.

From the foregoing disclosure, it will be understood by those having skill in the art that the present invention can have additional advantages and modifications. For example, the method of the present invention can be used to grow Si—Ge materials on substrates other than Si substrates, such as for example glass substrates. Moreover, the facile reactivity of $(H_3Ge)_2SiH_2$, $(H_3Ge)_3SiH$ and $(H_3Ge)_4Si$ paves the way to growing SiGe materials on specialty substrates that can withstand processing as high as 300° C., such as plastic substrates used for flexible displays. As another example, the method can be used to form a SiGeN layer by mixing the precursor with a nitrogen source to create the SiGeN layer.

Therefore, the invention in its broader aspects is not limited to the specific details, representative devices, and illustrative examples shown and described. Accordingly, departures may be made from such details without departing from the spirit or scope of the general inventive concept.

What is claimed is:

1. A method for depositing an epitaxial Si—Ge layer on a substrate in a reaction chamber, the method comprising:
   introducing into the chamber a gaseous precursor comprising $(H_3Ge)_xSiH_{4-x}$, wherein x=2, 3 or 4, wherein the gaseous precursor is introduced at a temperature of between 300° C. and 450° C., and the gaseous precursor comprises the precursor intermixed with an inert carrier gas, under conditions whereby an epitaxial layer comprising a Si—Ge material is formed on the substrate.

2. The method of claim 1 wherein the step of introducing the gaseous precursor comprises introducing the precursor as a single gas source.

3. The method of claim 1 wherein the carrier gas comprises $H_2$.

4. The method of claim 1 wherein the carrier comprises $N_2$.

5. The method of claim 1 wherein the gaseous precursor is deposited by low pressure chemical vapor deposition.

6. The method of claim 1 wherein the gaseous precursor is deposited by ultra-high vacuum chemical vapor deposition.

7. The method of claim 1 wherein the gaseous precursor is deposited by gas source molecular beam epitaxy.

8. The method of claim 1 wherein the Si—Ge material comprises SiGeN.

9. The method of claim 1 further comprising the step of doping the Si—Ge material with an element selected from the group consisting of boron, phosphorus, arsenic, antimony and indium.

10. The process of claim 1 further comprising a Si substrate patterned to achieve selective growth of the Si—Ge material on the substrate.

11. The method of claim 1 wherein the gaseous precursor is introduced as a mixture comprising $(H_3Ge)_xSiH_{4-x}$ and a germanium hydride, a silicon hydride or a silicon hydride-halide.

12. The method of claim 1 wherein the precursor comprises $(H_3Ge)_2SiH_2$.

13. The method of claim 1 wherein the precursor comprises $(H_3Ge)_3SiH$.

14. The method of claim 1 wherein the precursor comprises $(H_3Ge)_4Si$.

15. The method of claim 1 wherein the substrate comprises silicon.

16. The method of claim 15 wherein the silicon comprises Si(100).

17. The method of claim 1 wherein the gaseous precursor is introduced at a pressure in a range from $1\times10^{-7}$ Torr to at least 5 Torr.

18. The method of claim 1 wherein the epitaxial $SiGe_x$ layer is a strain free layer wherein the gaseous precursor is $(H_3Ge)_2SiH_2$, $(H_3Ge)_3SiH$, or $(H_3Ge)_4Si$ introduced a temperature of 400° C., 350° C., or 300° C. respectively, and wherein the epitaxial $SiGe_x$ layer has a root mean square surface roughness value between 0.5 nm and 1.0 nm over a 25 µm×25 µm area by atomic force microscopy.

19. The method of claim 1 wherein substantially the entire Si and Ge framework of the gaseous precursor is incorporated into the epitaxial $SiGe_x$.

20. A method for depositing an epitaxial SiGe layer on a substrate, wherein x=2, 3 or 4, the method comprising:
introducing near the surface of the substrate a gaseous precursor comprising $(H_3Ge)_xSiH_{4-x}$ wherein the gaseous precursor is introduced at a temperature of between 300° C. and 450° C., and the gaseous precursor comprises the precursor intermixed with an inert carrier gas; and
dehydrogenating the precursor under conditions whereby epitaxial $SiGe_x$ is formed on the substrate.

21. The method of claim 20 wherein the step of introducing the gaseous precursor comprises introducing the precursor as a single gas source.

22. The method of claim 20 wherein the carrier gas comprises $H_2$.

23. The method of claim 20 wherein the carrier comprises $N_2$.

24. The method of claim 20 wherein the gaseous precursor is deposited by low pressure chemical vapor deposition.

25. The method of claim 20 wherein the gaseous precursor is deposited by ultra-high vacuum chemical vapor deposition.

26. The method of claim 20 wherein the gaseous precursor is deposited by gas source molecular beam epitaxy.

27. The method of claim 20 wherein the precursor comprises $(H_3Ge)_2SiH_2$.

28. The method of claim 20 wherein the precursor comprises $(H_3Ge)_3SiH$.

29. The method of claim 20 wherein the precursor comprises $(H3Ge)_4Si$.

30. The method of claim 20 wherein the substrate comprises silicon.

31. The method of claim 30 wherein the substrate comprises Si(100).

32. The method of claim 20 wherein the substrate comprises glass.

33. The method of claim 20 wherein the substrate comprises plastic.

34. The method of claim 20 further comprising the step of doping the epitaxial $SiGe_x$ with an element selected from the group consisting of boron, arsenic, phosphorus, arsenic, antimony and indium.

35. The method of claim 20 further comprising patterning the substrate to achieve selective growth of the epitaxial $SiGe_x$ on the substrate.

36. The method of claim 20 wherein the gaseous precursor comprises $(H_3Ge)_xSiH_{4-x}$, and a germanium hydride, a silicon hydride or a silicon hydride-halide.

37. The method of claim 20 wherein the gaseous precursor is introduced at a pressure in a range from $1\times10^{-7}$ Torr to at least 5 Torr.

38. The method of claim 20 wherein the epitaxial $SiGe_x$ comprises a strain free layer wherein the gaseous precursor is $(H_3Ge)_2SiH_2$, $(H_3Ge)_3SiH$, or $(H_3Ge)_4Si$ introduced a temperature of 400° C., 350° C., or 300° C. respectively, wherein the epitaxial $SiGe_x$ layer has a root mean square surface roughness value between 0.5 nm and 1.0 nm over a 25 µm×25 µm area by atomic force microscopy.

39. The method of claim 20 wherein substantially the entire Si and Ge framework of the gaseous precursor is incorporated into the epitaxial $SiGe_x$.

* * * * *